United States Patent [19]
Graf

[11] Patent Number: 5,982,029
[45] Date of Patent: Nov. 9, 1999

[54] SEMICONDUCTOR COMPONENT HAVING UPPER AND LOWER MOUNTING PLATES

[75] Inventor: Alfons Graf, Kaufering, Germany

[73] Assignee: Siemens Aktiengesellschaft, Munich, Germany

[21] Appl. No.: 09/043,322

[22] PCT Filed: Jul. 14, 1997

[86] PCT No.: PCT/DE97/01483

§ 371 Date: Mar. 20, 1998

§ 102(e) Date: Mar. 20, 1998

[87] PCT Pub. No.: WO98/03998

PCT Pub. Date: Jan. 29, 1998

[30] Foreign Application Priority Data

Jul. 23, 1996 [DE] Germany ............... 196 29 768

[51] Int. Cl.⁶ .................................................. H01L 23/495
[52] U.S. Cl. .................................. 257/676; 257/692
[58] Field of Search .......................... 257/672, 676, 257/692, 723

[56] References Cited

U.S. PATENT DOCUMENTS

| | | |
|---|---|---|
| 5,409,866 | 4/1995 | Sato et al. |
| 5,448,106 | 9/1995 | Fujitsu ...................... 257/692 |
| 5,461,255 | 10/1995 | Chan et al. |
| 5,763,952 | 6/1998 | Lynch et al. ............... 257/692 |

OTHER PUBLICATIONS

Electronic Design, vol. 42, No. 9, May 2, 1994, Frank Goodenough, P–DMOSFET and TSSOP Turns on with 1.7 $V_{GS}$, pp. 89–95.

Electronics, vol. 59, No. 27, Jul. 24, 1996, Steve Zollo, The Boom Starts in Smart Power Products, pp. 97–101.

IEEE International Solid State Circuits Conference, vol. 31, Sandro Storti et al, A 30A 30V DMOS Motor Controller and Driver, pp. 192/193.

Elektronik, vol. 38, No. 11, May 26, 1989, Helmuth Lemme, Kraft und Intelligenz Vereint, pp. 80–83.

Siemens Components, vol. 30, No. 6, Alfons Graf, Smart SIPMOS Power Switches in Standard SMD Packages: Silicon instead of heat sinks, pp. 31–34.

Electronic Engineering, Dec. (1991), Y. Kasem et al, High--Performance Power Package for Power IC Devices—Part 1, pp. 35–43.

Elektronik 24/1992, Gerhard Moosburger, Smarte Intelligenz, pp. 28–31.

*Primary Examiner*—David B. Hardy
*Attorney, Agent, or Firm*—Hill & Simpson

[57] ABSTRACT

A metallic, lower mounting plate (21) is arranged in an insulating housing (20), a semiconductor body (23) with at least one logic part (24, 25) and at least one power part (26) with vertical MOS transistors being arranged on said lower mounting plate (21). A number of upper mounting plates (22) corresponding to the number of power parts (26) is introduced in the housing (20), said number of upper mounting plates (22) being electrically conductively secured on the upper sides of the power parts (26) of the semiconductor body (23) and being electrically connected to leads (4–6, 13–15). The lower leads covered by the upper leads are thereby recessed.

10 Claims, 1 Drawing Sheet

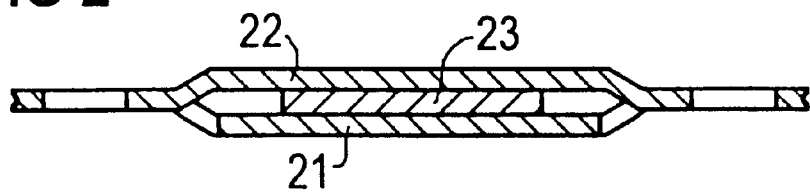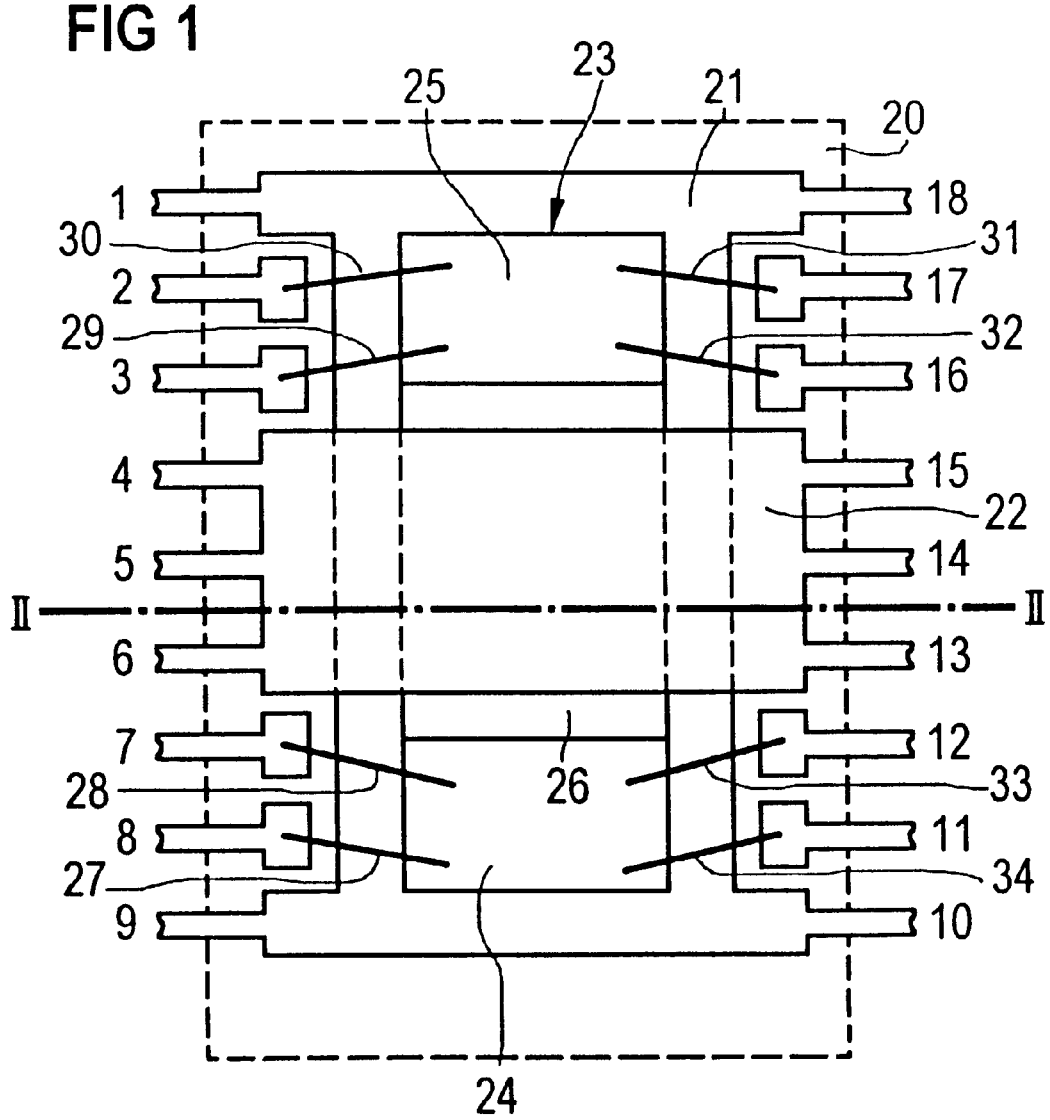

SEMICONDUCTOR COMPONENT HAVING UPPER AND LOWER MOUNTING PLATES

BACKGROUND OF THE INVENTION

The invention is directed to a semiconductor component with a) an insulating housing, b) a metallic, lower mounting plate arranged in the housing, c) a semiconductor body with at least one logic part and at least one power part with vertical MOS transistors, whereby d) the semiconductor body has its underside electrically conductively secured on the mounting plate, e) metallic, lower leads that are electrically connected to the semiconductor body and whereof at least one is electrically connected to the mounting plate.

Semiconductor components with such housings are known. Such housing forms are, for example, the DIL housing (Dual-In-Line) or P-DSO housing (Plastic-Dual-Small-Outline). The former housings are provided for normal mounting and the latter housings are provided for what is referred to as surface mounting (SMD) on printed circuit boards. These housings contain a metallic mounting plate as well as metallic leads that are electrically connected to the mounting plate or, respectively, the components secured on the mounting plate. The mounting plate and the leads are cut from a leadframe.

The semiconductor bodies are then connected to the leads via what is referred to as the bond wire technique.

It has turned out given semiconductor bodies that are composed of a logic part and of a power part with vertical MOS transistors that limits are placed on the realization of extremely low-impedance power switches due to the notoriously known bond wire technique. Given the employment, for example, of eight bond wires connected parallel having 50 μm diameters, an additive on-state dc resistance of approximately 5 mΩ derives. Given a power switch with, for example, 25 mΩ overall on-state dc resistance, an added outlay of approximately 4 qmm silicon is caused in the semiconductor body for the compensation of the impedance caused by the parallel bond wires.

Moreover, multiple bondings are generally undesirable and represent a quality problem.

SUMMARY OF THE INVENTION

The invention is therefore based on the object of improving a semiconductor component of the species initially cited such that an added outlay of silicon is unnecessary and especially low-impedance power switches can be realized.

This object is inventively achieved with a semiconductor element that is characterized in that the housing comprises a number of upper mounting plates corresponding to the number of power parts, said number of upper mounting plates being electrically conductively secured on the upper sides of the power parts of the semiconductor body and being electrically connected to leads.

As a result of this concept, an extremely low-impedance main current path is achieved from the lower mounting plates and the lower leads to the upper mounting plate and the upper leads given power parts with vertical MOS transistors.

A further advantage is comprised therein that the upper mounting plate lies very close to the active semiconductor layer of the vertical MOS transistors. As a result thereof, the upper mounting plate forms a very good thermal storing capacity for the power switch. This is particularly advantageous in the employment of the semiconductor component given brief-duration dissipated power absorption.

In a preferred embodiment, the lower leads covered by the upper leads are recessed and the upper and lower leads lie in a common plane. As a result thereof, the semiconductor body is packed sandwich-like and no problems given introduction into the housing derive.

Typically, the housing is cuboid and the leads project from the housing at the long sides.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 a view onto the conductor system of the semiconductor component; and

FIG. 2 a section along the line I—I from FIG. 1.

DESCRIPTION OF THE PREFERRED EMBODIMENTS

The semiconductor component according to FIG. 1 is accommodated in a fully insulating housing 20 of plastic. The exterior contour of the housing 20 is schematically shown by broken lines. Here, for example, the housing is of the type P-DSO-18 with eighteen leads that are provided with reference characters 1 through 18. The housing 20 contains a lower mounting plate 21 that are connected to the leads 1–3, 7–8, 10–12 and 16–18. The semiconductor body 23 is arranged on this lower mounting plate 21. The semiconductor body 23 is fixed on the lower mounting plate 21, for example by soldering or with a conductive glue, and is thereby electrically and thermally conductively connected to the lower mounting plate 21.

The semiconductor body 23 is composed of two logic parts 24, 25 and a power part 26. The power part 26 represents a semiconductor switch that is constructed of vertical MOS transistors. An upper mounting plate 22 is arranged onto the surface of the power part 26. This upper mounting plate is likewise fixed by soldering or with a conductive glue and is thus electrically and thermally conductively connected to the active semiconductor layer of the power part 26.

The upper mounting plate 22 is provided with leads 4–6 and 13–25. The lower leads covered by the upper leads 4–6 and 13–15 are recessed on the lower mounting plate 21, i.e. the upper mounting plate 22, with its upper leads 4–6 and 13–15, forms the leads missing in the lower mounting plate 21.

At their side facing away from the lower mounting plate 21, the logic parts 24, 25 are connected by bond wires 27–34 to the leads 2, 3, 7, 8, 11, 12, 16 and 17 that have no electrical connection to the lower mounting plate 21.

As can be seen from FIG. 2, the upper leads 4–6 and 13–15 and the lower leads 1–3, 7–8, 10–12 and 16–18 lie in a common plane. Ultimately, the leads 1–18 project from the housing (not shown) in a common plane at the long sides.

The disclosed method can also be expanded for the terminals of the logic part.

Thus, webs in the upper mounting plate can also produce the connections to the pads 2–3, 7–8, 11–12, 16–17.

Then lower mounting plate then only contacts toward the drain terminal of the power transistor.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A semiconductor component comprising:

an insulating housing;

a metallic, lower mounting plate in the housing;

a semiconductor body with at least one logic part and at least one power part with vertical MOS transistors;

the semiconductor body having an underside electrically conductively secured on the mounting plate;

metallic, lower first leads that are electrically connected to the semiconductor body, at least one of said first leads electrically connected to the mounting plate;

the housing having at least one upper mounting plate corresponding in number to the at least one power part, said upper mounting plate being electrically conductively secured on an upper side of the power part of the semiconductor body and being electrically connected to upper second leads.

2. The semiconductor component according to claim 1, wherein the lower first leads, that are covered by the upper second leads, are recessed.

3. The semiconductor component according to claim 2, wherein the upper second leads and the lower first leads lie in a common plane.

4. The semiconductor component according to claim 3, wherein the housing is cuboid.

5. A semiconductor component comprising:

an insulating housing;

a metallic, lower mounting plate in the housing;

a semiconductor body having at least one logic part and a plurality of power parts with vertical MOS transistors;

the semiconductor body having an underside electrically conductively secured on the mounting plate;

metallic, lower first leads that are electrically connected to the semiconductor body, at least one of the lower leads electrically connected to the lower mounting plate;

the housing having a plurality of upper mounting plates corresponding in number to the plurality of power parts, said upper mounting plates being electrically conductively secured on upper sides of the power parts of the semiconductor body and being electrically connected to upper leads.

6. The semiconductor component according to claim 5, wherein the lower first leads, covered by the upper second leads, are recessed.

7. The semiconductor component according to claim 6, wherein the upper leads and the lower leads lie in a common plane.

8. The semiconductor component according to claim 7, wherein the housing is cuboid.

9. A semiconductor component, comprising:

an insulating housing;

a metallic, lower mounting plate in the housing;

a semiconductor body with at lest one logic part and a plurality of power parts with vertical MOS transistors;

the semiconductor body having its underside electrically conductively secured on the mounting plate;

metallic, lower leads that are electrically connected to the semiconductor body, at least one of the lower leads is electrically connected to the mounting plate;

the housing having a plurality of upper mounting plates corresponding in number to the plurality of power parts, said upper mounting plates being electrically conductively secured on upper sides of the power parts of the semiconductor body and being electrically connected to upper leads; and the upper leads and the lower leads being in a common plane and being recessed.

10. The semiconductor component according to claim 9, wherein the housing is cuboid.

* * * * *